United States Patent
Wuerstlein et al.

(10) Patent No.: US 9,255,952 B2
(45) Date of Patent: Feb. 9, 2016

(54) CAPACITIVE SENSOR FOR AN ANTI-COLLISION APPARATUS

(71) Applicant: BROSE FAHRZEUGTEILE GMBH & CO. KOMMANDITGESELLSCHAFT, HALLSTADT, Hallstadt (DE)

(72) Inventors: Holger Wuerstlein, Zeil am Main (DE); Florian Pohl, Ebersdorf (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 213 days.

(21) Appl. No.: 13/930,556

(22) Filed: Jun. 28, 2013

(65) Prior Publication Data

US 2014/0002116 A1 Jan. 2, 2014

(30) Foreign Application Priority Data

Jun. 28, 2012 (DE) .......................... 10 2012 012 864

(51) Int. Cl.
*G01R 27/26* (2006.01)
*G01D 5/241* (2006.01)
(Continued)

(52) U.S. Cl.
CPC .............. *G01R 27/2605* (2013.01); *G01D 5/24* (2013.01); *G01D 5/241* (2013.01); *G01D 5/2412* (2013.01); *G01V 3/088* (2013.01); *G01D 5/2417* (2013.01)

(58) Field of Classification Search
CPC ..... G01R 27/2605; G01V 3/088; G01D 5/24; G01D 5/241; G01D 5/2412; G01D 5/2417

USPC .......... 324/76.11–76.83, 459, 600, 649, 658, 324/667, 674, 681, 707, 661, 662, 663, 669, 324/671, 684, 686, 76.79, 76.81, 123 R, 324/123 C; 702/47, 52
See application file for complete search history.

(56) References Cited

U.S. PATENT DOCUMENTS

| | | | |
|---|---|---|---|
| 5,134,379 A | | 7/1992 | Maher et al. |
| 5,757,196 A | * | 5/1998 | Wetzel ................. H03K 17/955 307/116 |
| 6,072,318 A | * | 6/2000 | Jordil ............................ 324/660 |

(Continued)

FOREIGN PATENT DOCUMENTS

| CN | 101092864 A | 12/2007 |
|---|---|---|
| DE | 102007026307 A1 | 2/2008 |

(Continued)

OTHER PUBLICATIONS

DE 102007026307, Machine Translation, Feb. 7, 2008.*

*Primary Examiner* — Huy Q Phan
*Assistant Examiner* — Raul Rios Russo
(74) *Attorney, Agent, or Firm* — Laurence A. Greenberg; Werner H. Stemer; Ralph E. Locher

(57) ABSTRACT

A capacitive sensor detects an object, in particular detects a collision in the case of a movable vehicle part. The sensor has an electrode arrangement which contains at least one sensor electrode. The sensor also has an evaluation circuit which is connected downstream of the sensor electrode and is intended to process a reception signal generated in the sensor electrode. In this case, the evaluation circuit contains a transimpedance amplifier which has a device for compensating for the frequency response.

5 Claims, 2 Drawing Sheets

(51) Int. Cl.
  *G01D 5/24* (2006.01)
  *G01V 3/08* (2006.01)

(56) References Cited

U.S. PATENT DOCUMENTS

| | | | |
|---|---|---|---|
| 6,486,681 B1* | 11/2002 | Weber et al. | 324/662 |
| 7,825,735 B1* | 11/2010 | Wessendorf | 330/308 |
| 8,466,748 B2 | 6/2013 | Rau | |
| 2003/0090326 A1 | 5/2003 | Pogrebinsky et al. | |
| 2011/0316304 A1 | 12/2011 | Schwaiger et al. | |
| 2013/0141121 A1* | 6/2013 | Lamesch | H03K 17/955 324/681 |
| 2013/0176039 A1* | 7/2013 | Lamesch | H03K 17/955 324/683 |
| 2015/0015279 A1* | 1/2015 | Burger et al. | 324/679 |

FOREIGN PATENT DOCUMENTS

| | | |
|---|---|---|
| DE | 10 2007 001 712 A1 | 7/2008 |
| DE | 102008028932 A1 | 12/2009 |
| DE | 102009057931 A1 | 6/2011 |
| DE | 102009057934 A1 | 6/2011 |
| DE | 102010012433 A1 | 9/2011 |
| WO | 8903052 A1 | 4/1989 |

\* cited by examiner

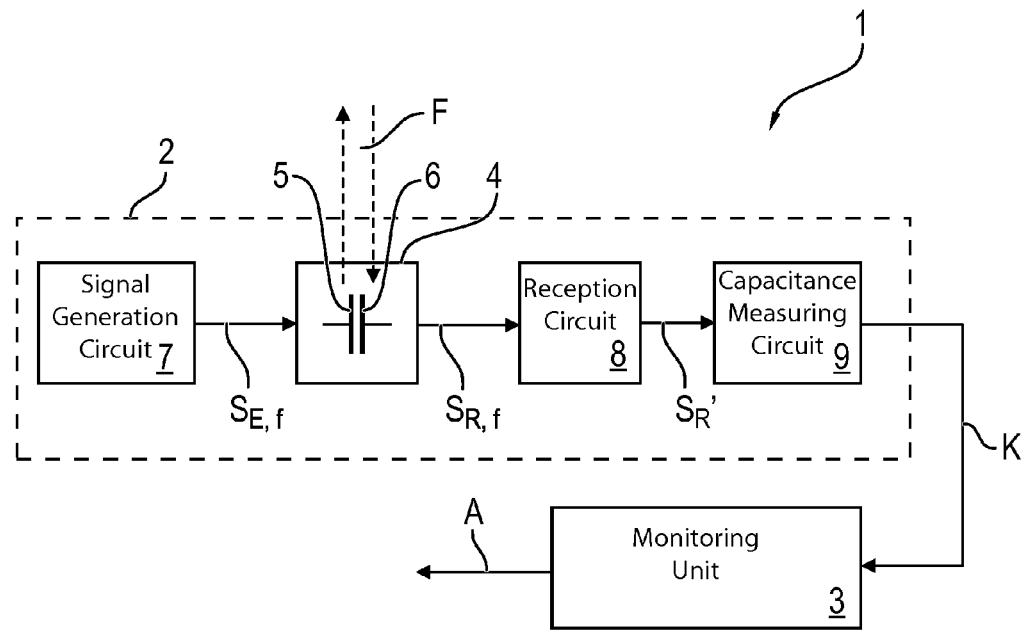
FIG. 1
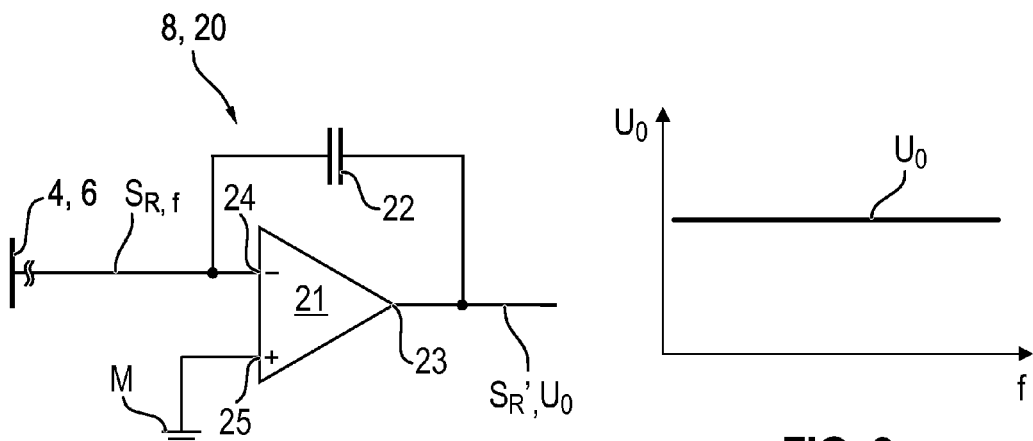
FIG. 2
FIG. 3

CAPACITIVE SENSOR FOR AN ANTI-COLLISION APPARATUS

CROSS-REFERENCE TO RELATED APPLICATION

This application claims the priority, under 35 U.S.C. §119, of German patent application No. DE 10 2012 012 864.9, filed Jun. 28, 2012, the prior application is herewith incorporated by reference in its entirety.

BACKGROUND OF THE INVENTION

Field of the Invention

The invention relates to a capacitive sensor for detecting an object, in particular a part of a person's body or an item, and to an anti-collision apparatus having such a sensor.

Capacitive sensors are used in automotive engineering, in particular within an anti-collision apparatus. Such an anti-collision apparatus is generally used to detect an obstacle in an opening area of a vehicle part which is movable between an open position and a closed position with respect to a fixed frame. The vehicle part—also referred to as an "adjustment element" below—is a window pane or a tailgate, in particular. Furthermore, the vehicle part or adjustment element to be monitored may also be a side door, a trunk lid or engine compartment cover, a sliding roof or a folding top. Anti-collision apparatuses are used in this case, in particular, when the respective associated vehicle part is moved by a motor.

The space covered by the adjustment element during an adjustment movement is referred to as the opening area. The opening area of the adjustment element includes, in particular, the area of space arranged between a closing edge of the adjustment element and a corresponding edge of the frame which rests against the closing edge in the closed position of the adjustment element.

When closing adjustment elements of a vehicle, in particular a vehicle window or tailgate, there is generally the risk of body parts or other items of the adjustment element being trapped between the closing edge of the adjustment element and the bodywork. The anti-collision apparatus which is also referred to as an anti-trapping apparatus in this application is used to avoid such trapping and the resultant risk of personal injury and/or material damage by virtue of the anti-collision apparatus detecting obstacles in the opening area and stopping or reversing the closing movement in this case.

Furthermore, such an anti-collision apparatus can also be used—in the case of adjustment elements which pivot out—to detect obstacles which obstruct the opening of the adjustment element. In this application too, the anti-collision apparatus stops or reverses the movement of the adjustment element if it detects such an obstacle in order to avoid material damage as a result of the adjustment element colliding with the obstacle.

In this case, a distinction is made between indirect and direct anti-collision apparatuses. An indirect anti-collision apparatus detects the trapping or collision by monitoring an operating variable of the servo motor driving the adjustment element, in particular from an abnormal increase in the motor current or an abnormal decrease in the motor speed. A direct anti-collision apparatus usually contains one or more sensors which record a measurement variable characteristic of the presence or absence of an obstacle in the opening area as well as an evaluation unit which uses this measurement variable to decide whether an obstacle is present in the opening area and to initiate corresponding countermeasures if necessary.

Among the direct anti-collision apparatuses, a distinction is again made between systems with so-called contact sensors which indicate the presence of an obstacle only when the obstacle has already touched the sensor and systems with contactless sensors which already detect an obstacle at a certain distance from the sensor. The contactless sensors include, in particular, so-called capacitive (proximity) sensors.

A capacitive sensor usually contains an electrode arrangement having one or more (sensor) electrodes which are used to build up an electric field in the opening area of the adjustment element. An obstacle in the opening area is detected by monitoring the capacitance of the electrode arrangement. In this case, use is made of the fact that an obstacle, in particular a human body part, influences the electric field generated by the sensor and thus influences the capacitance of the electrode arrangement.

In a conventional design of such a capacitive sensor, the electrode arrangement of this sensor contains, as sensor electrodes, at least one transmission electrode, which is connected to a signal generation circuit for generating a transmission signal, and a reception electrode which is connected to an evaluation circuit for processing a reception signal generated in the reception electrode (transmitter/receiver principle). Such a sensor measures the capacitance formed between the transmission electrode and the reception electrode or a measurement variable correlated therewith.

In an alternative design, the electrode arrangement of a capacitive sensor contains only one sensor electrode or a plurality of identical sensor electrodes to which the transmission signal is applied and which are also used to record the capacitance-dependent reception or response signal, for example in the form of the displacement current (single-electrode principle). In the case of such a sensor, the counter-electrode used is a sensor-external item at ground potential, in particular the bodywork of the vehicle in which the sensor is installed. In the case of such a sensor, the capacitance of the sensor electrode(s) with respect to ground is therefore recorded as the measurement variable.

An electrical alternating signal which oscillates at a predefined transmission frequency is usually used as the transmission signal. The evaluation circuit often has a low impedance in order to measure the displacement current induced in the sensor electrode (in particular the reception electrode). In this case, the evaluation circuit often contains a transimpedance amplifier. Such a capacitive sensor is known, for example, from published, non-prosecuted German patent application DE 10 2007 001 712 A1.

In the case of an anti-collision apparatus having a capacitive sensor, detection errors may arise if the transmission frequency has interference, that is to say if an external alternating field, the frequency of which is the same as or similar to the transmission frequency of the sensor, is applied to the sensor electrode (in particular the reception electrode). Such a detection error may result, on the one hand, in the anti-collision apparatus incorrectly detecting trapping and stopping or reversing the movement of the adjustment element—objectively for no reason. On the other hand, however, such a detection error may also result in trapping which is actually present not being detected by the anti-collision apparatus.

In order to avoid such disruptions, it is sometimes desirable to change the frequency of the transmission signal in order to be able to divert to a frequency without interference. However, in capacitive sensors, the evaluation circuit of which is formed by a conventional transimpedance amplifier with resistive negative feedback, it is difficult to change the frequency by virtue of the fact that the impedance of the sensor provided with such a transimpedance amplifier has a pronounced frequency dependence. In the sensor known from DE 10 2007 001 712 A1, this frequency dependence (also referred to as the frequency response) is even intensified further by virtue of the fact that the transimpedance amplifier there does not have negative feedback as a result of a non-reactive resistor but rather as a result of a parallel resonant circuit with a capacitance and an inductance connected in parallel with the latter. Such a sensor has high frequency selectivity. It is thus insensitive to interference with small frequency components at the transmission frequency. However, the reaction of such a sensor is all the more sensitive if the transmission frequency, in particular, has considerable interference.

SUMMARY OF THE INVENTION

The invention is based on the object of specifying a capacitive sensor which is unsusceptible to interference and is intended to detect an object and an associated anti-collision apparatus, in particular for detecting and avoiding trapping or another collision between a movable vehicle part and an object.

With the foregoing and other objects in view there is provided, in accordance with the invention, a capacitive sensor for detecting an object. The capacitive sensor containing an electrode configuration having at least one sensor electrode and an evaluation circuit connected downstream of the sensor electrode for processing a reception signal generated by the sensor electrode. The evaluation circuit has a transimpedance amplifier, the transimpedance amplifier has means for compensating for a frequency response.

The sensor according to the invention contains an electrode arrangement which contains at least one sensor electrode. The sensor also contains an evaluation circuit which is connected downstream of the at least one sensor electrode. The evaluation circuit is used to process a reception signal (or response signal) which is generated in the sensor electrode under the action of an electric field emitted using the electrode arrangement.

In this case, the evaluation circuit has, according to the invention, a low-impedance input circuit which is formed by a transimpedance amplifier. In contrast to a conventional transimpedance amplifier, the transimpedance amplifier according to the invention has means for compensating for the frequency response, that is to say means which eliminate the frequency dependence of the sensor provided with the transimpedance amplifier, at least in a predefined frequency range.

The invention may be applied, in principle, to capacitive sensors which operate according to the single-electrode principle and sense the capacitance of their sensor electrode(s) with respect to ground. However, the sensor is preferably a capacitive sensor which operates according to the transmitter/receiver principle. Accordingly, the electrode arrangement preferably contains, as sensor electrodes, at least one transmission electrode and at least one reception electrode. The evaluation circuit—also referred to as the reception circuit in this case—is connected downstream of the at least one reception electrode here and receives, as the input variable, the reception signal generated in the reception electrode under the action of the electric field emitted by the at least one transmission electrode.

Like a conventional transimpedance amplifier, the transimpedance amplifier according to the invention preferably has, as a central component, an operational amplifier, the non-inverting input of which is connected to ground and the inverting input of which is directly or indirectly connected to the reception electrode.

However, in contrast to a conventional transimpedance amplifier, in one preferred embodiment of the invention, the output of the operational amplifier, as the means for compensating for the frequency response, is not coupled with negative feedback to the inverting input via a non-reactive resistor but rather solely via a coupling capacitance (that is to say one or more capacitors). This eliminates the frequency dependence of the sensor in a manner independent of the frequency. In particular, the gain factor of the operational amplifier varies in the opposite direction to the frequency dependence of the sensor capacitance as a result of the capacitive negative feedback, with the result that the frequency dependence of the sensor capacitance is compensated for all frequencies.

In an alternative embodiment of the invention, the output of the operational amplifier is coupled with negative feedback to the inverting input via a parallel circuit containing a coupling capacitance and a non-reactive coupling resistor. In this embodiment, the transimpedance amplifier has a high-pass filter behavior. In this case, the frequency response compensation therefore works only for high frequencies, while the gain factor of the sensor decreases greatly as the frequency falls for frequencies below a lower cut-off frequency. The operational amplifier is preferably connected in such a manner that the lower cut-off frequency is between 1 kHz and 1 MHz, in particular is at approximately 100 kHz, depending on the desired operating frequency.

Whereas the operational amplifier is connected to the reception electrode directly or via a low-pass filter in a basic variant of the embodiment described above, an inductance is connected upstream of the inverting output of the operational amplifier in a further development of the embodiment described above. The inductance is therefore interposed between the inverting output of the operational amplifier and the reception electrode. In this embodiment, the transimpedance amplifier has a bandpass filter behavior. In this case, the frequency response compensation therefore works only in a predefined frequency range, while the gain factor of the sensor decreases greatly as the frequency decreases or increases both for frequencies below the lower cut-off frequency and for frequencies above an upper cut-off frequency. The operational amplifier is preferably connected in such a manner that the upper cut-off frequency is between 1 MHz and 100 MHz, in particular is at approximately 10 MHz, depending on the desired operating frequency.

In one expedient development, the design and/or material composition of the coupling capacitance is/are the same as or similar to that/those of the sensor electrode(s). Additionally or alternatively, the coupling capacitance is preferably arranged in such a manner that it is exposed to the same or similar operating conditions (for example temperature, dirt, moisture, operating age etc.) as the sensor electrode(s). These measures result in the coupling capacitance performing any capacitance drift on the basis of the temperature, the operating age etc. in the same manner as or in a similar manner to the electrode arrangement, with the result that the drift of the sensor electrode(s) is entirely or partially compensated for by the coupling capacitance, if necessary.

The anti-collision apparatus according to the invention contains a capacitive sensor of the type described above.

Other features which are considered as characteristic for the invention are set forth in the appended claims.

Although the invention is illustrated and described herein as embodied in a capacitive sensor for an anti-collision apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1 is a schematic block diagram of an anti-trapping apparatus for detecting and avoiding trapping in a case of a movable vehicle part, having a capacitive sensor which contains a transmission electrode, a reception electrode, a signal generation circuit connected upstream of the transmission electrode and a reception circuit connected downstream of the reception electrode according to the invention;

FIG. 2 is a simplified electrical circuit diagram of the structure of the reception circuit which is formed in this case substantially by a transimpedance amplifier which has negative feedback by a capacitance;

FIG. 3 is a graph showing a frequency response of the sensor provided with the transimpedance amplifier according to FIG. 2 of an output voltage with respect to the frequency of an input signal;

DESCRIPTION OF THE INVENTION

Figures 4, 5:
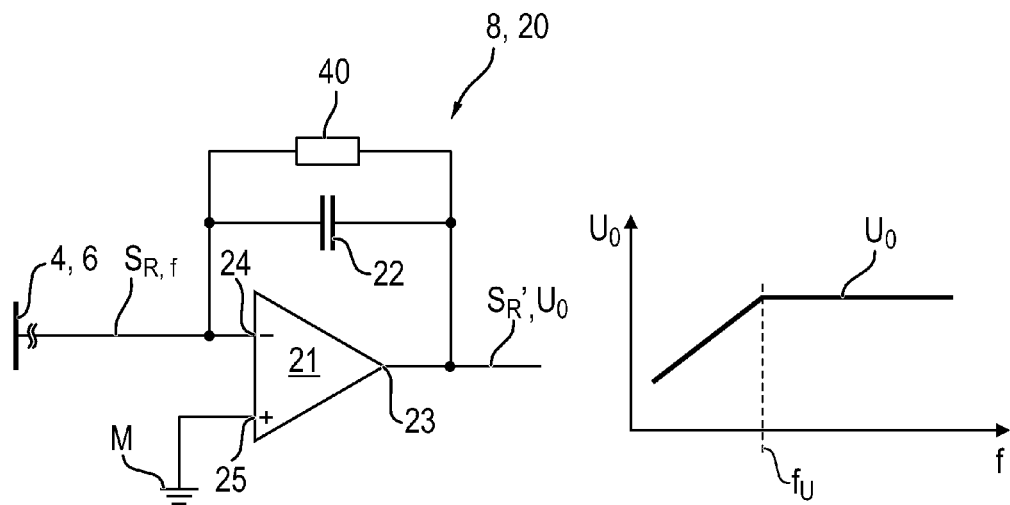
FIG. 4 is a simplified electrical circuit diagram showing a variant of the transimpedance amplifier there which in this case has negative feedback via a capacitance with a non-reactive resistor connected in parallel.
FIG. 5 is a graph showing the frequency response of the sensor provided with the transimpedance amplifier according to FIG. 4.

Mutually corresponding parts and variables are always provided with the same reference symbols in all the figures.

FIG. 1 shows a diagrammatic illustration of an anti-trapping apparatus 1 for a movable adjustment element of a motor vehicle, in particular a door or a tailgate which is moved by motor. The anti-trapping apparatus 1 contains a capacitive sensor 2 and a monitoring unit 3.

The sensor 2 is based on capacitive metrology. The sensor 2 accordingly contains an electrode arrangement 4 having at least one transmission electrode 5 and at least one counter-electrode or reception electrode 6. The electrode arrangement 4 preferably contains a plurality of transmission electrodes 5 which interact with a common reception electrode 6.

During operation of the sensor 2, an electric field F (only indicated) is generated in an opening area of the adjustment element by applying an electrical AC voltage to the or each transmission electrode 5, while the (electrical) capacitance of the capacitor formed from the field-emitting transmission electrode 5 and the reception electrode 6 or a measurement variable correlated therewith is recorded using the reception electrode 6.

In detail, the sensor 2 contains, in addition to the electrode arrangement 4, a signal generation circuit 7, a reception circuit 8 and a capacitance measuring element 9.

During operation of the sensor 2, the signal generation circuit 7 generates a transmission signal $S_E$ in the form of a sinusoidal AC voltage or a pulsed voltage signal at a predefined frequency f. The signal generation circuit 7 passes the transmission signal $S_E$ to the transmission electrode 5 which emits the electric field F under the action of the transmission signal $S_E$. If the sensor 2 contains a plurality of transmission electrodes 5, a time division multiplexer is preferably interposed between the signal generation circuit 7 and the electrode arrangement 4 and passes the transmission signal $S_E$ to one of the plurality of transmission electrodes 5 in each case in an alternating manner in terms of time.

An electrical alternating signal which is referred to as the reception signal $S_R$ below is generated in the reception electrode 6 under the action of the electric field F. During interference-free operation, the reception signal $S_R$ is phase-synchronous with the transmission signal $S_E$ and therefore oscillates at the frequency f of the transmission signal $S_E$. In contrast to the transmission signal $S_E$, however, the signal amplitude of the reception signal $S_R$ additionally varies on the basis of the capacitance to be measured.

The reception signal $S_R$ is supplied to the reception circuit 8 as an input signal. In this case, a low-pass filter for pre-filtering the reception signal $S_R$ is optionally interposed between the reception electrode 6 and the reception circuit 8. The reception circuit 8 contains a transimpedance amplifier 20 (FIG. 2) as a fundamental component. In this case, the reception circuit 8 outputs a voltage signal—referred to as the reception signal $S_R'$ below—which is proportional to the displacement current induced in the reception electrode 6 under the action of the transmission signal $S_E$. The reception signal $S_R'$ is supplied to the capacitance measuring element 9 which is connected downstream of the reception circuit 8 and generates a capacitance-proportional measurement variable K therefrom.

The measurement variable K is supplied to the monitoring unit 3 connected downstream of the sensor 2. The monitoring unit 3 which is preferably formed by a microcontroller with monitoring software implemented therein compares the measurement variable K with a stored triggering threshold value. If the threshold value is exceeded, the monitoring unit 3 outputs a triggering signal A which indicates possible trapping, and the movement of the adjustment element associated with the anti-trapping apparatus 1 is reversed under the action of the signal.

According to FIG. 2, the transimpedance amplifier 20 is formed by an operational amplifier 21 and a coupling capacitance 22. An output 23 of the operational amplifier 21 is coupled with negative feedback to the inverting input 24 via the coupling capacitance 22. The operational amplifier 21 is connected to the reception electrode 6 directly—or indirectly via the low-pass filter which is possibly present—via the inverting input 24. The non-inverting input 25 of the operational amplifier 21 is connected to ground M. The coupling capacitance 22 preferably has a capacitance value of 10 pF.

FIG. 3 shows the frequency response of the sensor 2 provided with the transimpedance amplifier 20 according to FIG. 2, that is to say the dependence of an output voltage $U_0$ of the transimpedance amplifier 20 on the frequency f of the incoming reception signal $S_R$, in which case a constant signal amplitude of the transmission signal $S_E$ is assumed. In this case, the output voltage $U_0$ denotes the amplitude of the reception signal $S_R'$ output by the transimpedance amplifier 20. As can be gathered from FIG. 3, the sensor 2 provided with the transimpedance amplifier 20 according to FIG. 2 has a disappearing frequency response, that is to say a frequency response compensated to zero, on account of the exclusively capacitive negative feedback. In other words, the output voltage $U_0$ is at least approximately the same for all frequencies f with a constant signal amplitude of the transmission signal $S_E$.

FIG. 4 illustrates a variant of the transimpedance amplifier 20. This variant differs from the exemplary embodiment according to FIG. 2 in that a coupling resistor 40 is connected in parallel with the coupling capacitance 22. The coupling capacitance 22 preferably has—as in the example according to FIG. 2—a capacitance value of 10 pF. The non-reactive coupling resistor 40 preferably has approximately a resistance of 1 MΩ.

It can be seen from FIG. 5, which shows the frequency response of the sensor 2 provided with the transimpedance amplifier 20 according to FIG. 4, that the transimpedance amplifier 20 exhibits a high-pass filter behavior in the embodiment according to FIG. 4. In other words, the frequency response of the sensor 2 is compensated to zero only for frequencies f of the reception signal $S_R$ which exceed a lower cut-off frequency $f_U$ ($f>f_U$). In contrast, for frequencies f which undershoot the lower cut-off frequency $f_U$ ($f<f_U$), the output voltage $U_0$ falls greatly with decreasing frequency f—again with a constant signal strength of the transmission signal $S_E$.

Figures 6, 7:
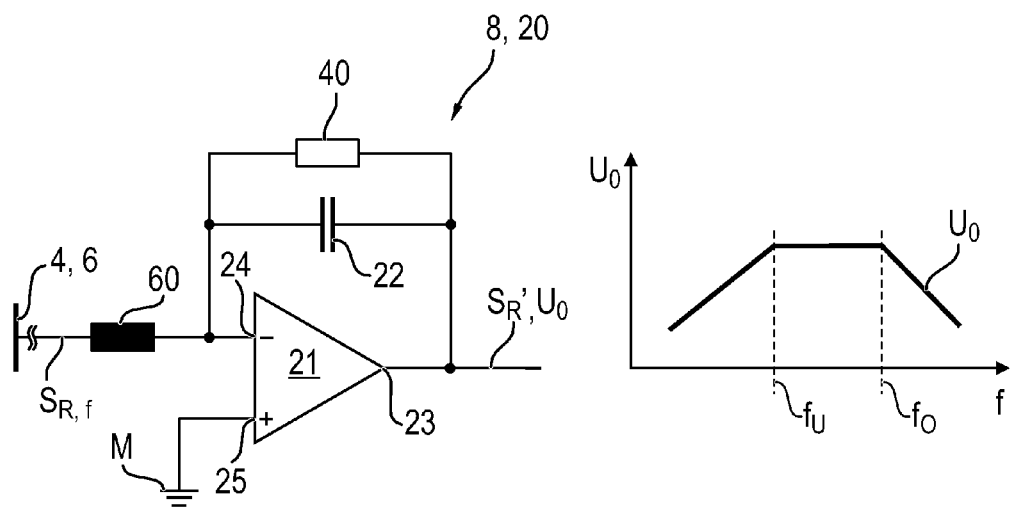
FIG. 6 is a simplified electrical circuit diagram showing a further development of the transimpedance amplifier which in this case is connected to an additional inductance on an input side.
FIG. 7 is a graph showing the frequency response of the sensor provided with the transimpedance amplifier according to FIG. 6.

FIG. 6 illustrates another variant of the transimpedance amplifier 20. This variant again differs from the embodiment according to FIG. 4 in that an inductance 60 is additionally connected upstream of the inverting input 24 of the operational amplifier 21. The inductance 60 is therefore interposed between the input 24 and the reception electrode 6. The coupling capacitance 22 and the non-reactive coupling resistor 40 preferably have—like in the example according to FIG. 4—a capacitance value of 10 pF and a resistance of 1 MΩ, respectively. The inductance 60 has an inductance value of 10 μH, for example.

It can be seen from FIG. 7, which shows the frequency response of the sensor 2 provided with the transimpedance amplifier 20 according to FIG. 6, that the sensor 2 exhibits a bandpass filter behavior in this case. The frequency response of the sensor 2 is here accordingly compensated to zero only in a frequency range between the lower cut-off frequency $f_U$ and an upper cut-off frequency $f_O$ ($f_U \leq f \leq f_O$). The output voltage $U_0$ falls with decreasing or increasing frequency f—again with a constant signal strength of the transmission signal $S_E$—both for frequencies f which undershoot the lower cut-off frequency $f_U$ ($f<f_U$) and for frequencies f which exceed the upper cut-off frequency $f_O$ ($f>f_O$).

Although the invention becomes particularly clear from the above exemplary embodiments, it is not restricted to the latter. Rather, numerous further embodiments of the invention may be derived by a person skilled in the art from the above description.

The invention claimed is:

1. A capacitive sensor for detecting an object, the capacitive sensor comprising:

an electrode configuration having at least one sensor electrode;

an evaluation circuit connected downstream of said sensor electrode for processing a reception signal generated by said sensor electrode, said evaluation circuit having a transimpedance amplifier, said transimpedance amplifier having means for compensating for a frequency response, said transimpedance amplifier having an operational amplifier with a non-inverting input connected to one of ground or another reference potential, an inverting input connected to said sensor electrode, and an output coupled with negative feedback to said inverting input, said means for compensating for the frequency response, via said negative feedback, including a capacitance and a non-reactive resistor connected in parallel to said capacitance; and an inductance connected between said sensor electrode and said inverting input of said operational amplifier.

2. The sensor according to claim 1, wherein:

said sensor electrode having at least one transmission electrode for emitting an electric field when a transmission signal is applied and at least one reception electrode; and said evaluation circuit being connected downstream of said reception electrode for processing the reception signal generated in said reception electrode under an action of the electric field.

3. The sensor according to claim 1, wherein said transimpedance amplifier has an operational amplifier with a non-inverting input connected to one of ground or another reference potential, an inverting input connected to said sensor electrode, and an output coupled with negative feedback to said inverting input, and forms said means for compensating for the frequency response, solely via said negative feedback including a capacitance.

4. The sensor according to claim 1, wherein the sensor detects a collision in a case of a movable vehicle part.

5. An anti-collision apparatus, comprising:

a capacitive sensor for detecting an object, said capacitive sensor containing an electrode configuration having at least one sensor electrode, and an evaluation circuit connected downstream of said sensor electrode for processing a reception signal generated by said sensor electrode, said evaluation circuit having transimpedance amplifier, said transimpedance amplifier having means for compensating for a frequency response, said transimpedance amplifier having an operational amplifier with a non-inverting input connected to one of ground or another reference potential, an inverting input connected to said sensor electrode, and an output coupled with negative feedback to said inverting input, said means for compensating for the frequency response, via said negative feedback, including a capacitance, a non-reactive resistor connected in parallel to said capacitance and an inductance connected between said sensor electrode and said inverting input of said operational amplifier.

* * * * *